United States Patent [19]
Uno et al.

[11] Patent Number: 4,983,548
[45] Date of Patent: Jan. 8, 1991

[54] METHOD OF FABRICATING A SEMICONDUCTOR DEVICE INCLUDING REMOVAL OF ELECTRIC CHARGES

[75] Inventors: Masaaki Uno, Kawasaki; Masanori Kobayashi, Tokyo; Kazushi Nakashima, Kawasaki, all of Japan

[73] Assignees: Fujitsu Limited, Kawasaki; Fujitsu VLSI Limited, Kasugai, both of Japan

[21] Appl. No.: 524,107

[22] Filed: May 16, 1990

[30] Foreign Application Priority Data

May 17, 1989 [JP] Japan .................. 1-123048

[51] Int. Cl.⁵ .......................... H01L 21/306
[52] U.S. Cl. .................. 437/250; 437/939; 437/946; 148/DIG. 17
[58] Field of Search .......... 437/946, 939, 250; 134/37; 148/DIG. 17; 75/1.5 R

[56] References Cited

U.S. PATENT DOCUMENTS

| | | | |
|---|---|---|---|
| 3,665,694 | 5/1972 | Ford et al. | 134/37 |
| 4,132,567 | 1/1979 | Blackwood | 134/1 |
| 4,186,032 | 1/1980 | Ham | 134/37 |
| 4,608,097 | 8/1986 | Weinberger | 148/33.3 |
| 4,677,704 | 7/1987 | Huggins | 15/1.5 R |
| 4,923,828 | 5/1990 | Gluck et al. | 148/DIG. 17 |

FOREIGN PATENT DOCUMENTS 0013729 2/1981 Japan .................. 437/939
0003121 1/1985 Japan .................. 437/946

OTHER PUBLICATIONS

Amick, J. A. *Solid State Technology*, Nov. 1976, pp. 47–52.
Duffalo, J. M. et al., *Solid State Technology*, Mar. 1984, pp. 109–114.

*Primary Examiner*—Brian E. Hearn
*Assistant Examiner*—T. N. Quach
*Attorney, Agent, or Firm*—Armstrong, Nikaido, Marmelstein, Kubovcik & Murray

[57] ABSTRACT

A method of fabricating a semiconductor device comprises steps of accommodating a substrate on which the semiconductor device is to be fabricated in a container of an electrically insulating material, forming a film of a volatile organic solvent such that the film covers substantially an entire surface of the container and the substrate accommodated therein, said step of forming the film being performed while maintaining a connection between the film of the volatile organic solvent covering the surface of the container and the ground, so that electric charges are eliminated from the substrate and the container by flowing to the ground, and removing the film of the volatile organic solvent by evaporating the solvent.

8 Claims, 17 Drawing Sheets

DRYING TIME IN ROOM TEMPERATURE

FIG. 14

STORAGE: 24°c, 70%, 21HRS

| | IN DISCHARGED PFA CARRIER | IN CHARGED PFA CARRIER |
|---|---|---|
| BIFORE STORAGE | ○<br>S  0000<br>M  0000<br>L  0000<br>TOTAL 0000 | ○<br>S       1<br>M  0000<br>L  0000<br>TOTAL   1 |
| AFTER STORAGE | ○<br>S    8<br>M    3<br>L    3<br>TOTAL  14 | ○<br>S   42<br>M   23<br>L   27<br>TOTAL  92 |

METHOD OF FABRICATING A SEMICONDUCTOR DEVICE INCLUDING REMOVAL OF ELECTRIC CHARGES

BACKGROUND OF THE INVENTION

The present invention generally relates to fabrication of semiconductor devices and more particularly to a method of fabricating a semiconductor device including a step of eliminating electric charges from the semiconductor device together with a carrier used for holding the semiconductor device which is under fabrication.

Generally, the process of fabricating a semiconductor device includes steps such as cleaning, storing and transporting semiconductor wafers on which the semiconductor devices are to be formed. During the foregoing steps, the semiconductor wafers are accommodated in a container called a carrier which has an appearance similar to a basket. While various materials such as silica are employed for the carrier, perfluoroalcoxy resin referred to hereinafter as PFA is particularly preferred because of the extremely low content of impurities which may otherwise cause contamination to the wafer, excellent stability in the high temperature environment, easiness of molding, and resistance against forming dusts even when contacted with the semiconductor wafer. On the other hand, the PFA carrier has a problem in that it tends to accumulate electric charges because of its high resistivity. For example, when the PFA carrier is lifted from a deionized water after immersion in the water for cleaning, electric charges of about $-10,000$ volts is accumulated on the PFA carrier. Once the carrier is charged as such, it takes about one hundred hours or more until the electric charges disappear as long as the discharge is made by a natural discharge process. When the carrier is charged electrically, the dusts in the environment are attracted to the carrier and thus to the semiconductor wafer held thereon. Note that the semiconductor wafers, too, have a thin oxide film on the surface and thus accumulates the electric charges when the PFA carrier is charged as such. This problem of attraction of dusts is particularly serious for the fine dusts having sub-micron particle diameters. In the conventional semiconductor devices designed for relatively low integration density with relatively coarse semiconductor patterns, this problem of the PFA carrier attracting dusts does not cause any critical problems, although such attraction is certainly not desirable. On the other hand, in the case of the semiconductor integrated circuits having a high integration density, the dusts having a particle size as small as about 0.05 $\mu$m are not tolerable. This value of particle size corresponds to about one-tenth of the width of the lines formed on the surface of the wafer by patterning. Thus, the problem of charging of the PFA carrier raises a serious problem in the fabrication of the semiconductor devices having extremely fine patterns.

In order to eliminate the foregoing problem, there is a proposal to incorporate carbon particles into the PFA forming the carrier. As a result of incorporation of the carbon particles, the PFA carrier is provided with a finite conductivity and a quick elimination of the electric charges is expected. However, this approach has a problem in that carbon particles introduced in PFA tends to enhance the reaction between PFA and chemical agents such as nitric acid used for cleaning and thereby PFA forming the carrier is deteriorated. Further, such a PFA carrier admixed with carbon particles tends to create dusts of carbon which are detrimental to the operation of the semiconductor device.

Alternatively, there is proposed an approach wherein the electric charges are eliminated by applying a surfactant on the surface of the PFA carrier. However, this approach, utilizing the surfactant which may contain impurities, increases the risk that the semiconductor device is contaminated by the impurities.

Alternatively, there is proposed another approach wherein the electric charges are eliminated from the semiconductor device as well as from the PFA carrier, by placing the semiconductor device and the PFA carrier in a stream of ionized air. This approach, however, requires an extra step wherein a high voltage has to be applied to produce the ionized air, and is therefore not desirable from the view point of safety and easiness of implementation.

SUMMARY OF THE INVENTION

Accordingly, it is a general object of the present invention to provide a novel and useful method of fabricating a semiconductor device including a step of eliminating electric charges form the semiconductor device under fabrication.

Another object of the present invention is to provide a method of fabricating a semiconductor device wherein elimination of electric charges from the semiconductor device under fabrication is made reliably by a simple and safe procedure.

Another object of the present invention is to provide a method of fabricating a semiconductor device, comprising steps of: accommodating a substrate on which the semiconductor device is to be fabricated in a container of an electrically insulating material, said container being connected to the ground by an electrically conductive means, forming a film of a volatile organic solvent such that the film covers substantially an entire surface of the container and the substrate accommodated therein, said step of forming the film being performed while maintaining the connection between the film of the volatile organic solvent covering the surface of the container and the ground, and removing the film of the volatile organic solvent. In a preferred embodiment, the film of the volatile solvent is formed by dipping the substrate and the container in a pool of the volatile organic solvent, and the step of removing the film is performed by lifting up the substrate and the container from the pool of the volatile organic solvent. In another preferred embodiment, the film of the volatile organic solvent is formed by condensing a vapor of the volatile organic solvent on the entire surface of the substrate and the container. According to the present invention, it was found that any electric charge accumulated on the container and on the substrate is eliminated through the electrically conductive means. Thereby, the problem of adsorption of dusts on the container and the on the substrate held therein by the electrostatic attraction, which in turn is caused by the electric charges, is successfully eliminated.

Another object of the present invention is to provide a method of fabricating a semiconductor device comprising steps of: accommodating a substrate on which the semiconductor device is to be fabricated, in a container of an electrically insulating material, cleaning the substrate together with the container in a purified water, dipping the container, after the step of cleaning in the purified water, together with the substrate accommodated therein, into a volatile organic solvent held electrically at the ground voltage level, removing the substrate together with the container from the volatile organic solvent, and removing the volatile organic solvent from the substrate and the container. According to the present invention, the electric charges which are accumulated on the substrate as well as on the container in response to the cleaning in the purified water, is successfully and substantially eliminated by simply dipping the substrate together with the container into the volatile organic solvent and lifting up therefrom, after the step of cleaning in the purified water.

Another object of the present invention is to provide a method of fabricating a semiconductor device, comprising steps of: accommodating a substrate on which the semiconductor device is to be fabricated in a container of an electrically insulating material, said container being connected to the ground by an electrically conductive means, and exposing the substrate together with the container accommodating the substrate, prior to holding in an environment containing dusts, to an atmosphere containing the volatile organic solvent while maintaining the connection to the ground. According to the present invention, the electric charges which may cause attraction of dusts is eliminated completely before the processes such as transportation or storage wherein there is a substantial chance that the dusts are adsorbed on the semiconductor material when the container is electrostatically charged.

Other objects and further features of the present invention will become apparent from the following detailed description when read in conjunction with the attached drawings.

BRIEF DESCRIPTION OF THE DRAWINGS

FIG. 14 is a diagram showing visually the result of the test conducted according to the sequence of procedures of FIG. 13;

DETAILED DESCRIPTION

First, the finding made by the inventors which forms the basis of the present invention will be described with reference to FIGS. 1-9.

The inventors of the present invention have carried out a series of experiments to study the electric charging of plastics, particularly of PFA, by exposing PFA to various environments including purified water and volatile organic solvents particularly isopropyl alcohol referred to hereinafter as IPA.

Figure 1:
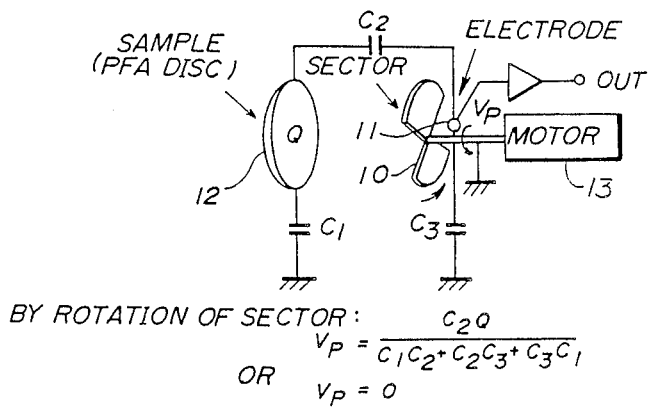
FIG. 1 is a diagram showing a system for measuring the electric charges used in the study forming the basis of the present invention.

FIG. 1 shows a system employed in the present experiments for measuring the charge voltage formed on the plastic samples. The measurement was made by a rotating sector type charge detector (Model-2B supplied by Hugle Electronics) wherein a rotary sector plate 10 is used to chop the electric field established between a detecting electrode 11 and a sample 12 periodically. The rotary sector plate 10 is rotated by a motor 13, and in response to the rotation of the sector plate 10, the electric field between the sample 12 and the detection electrode 11 is changed periodically. Thereby, an alternating current voltage proportional in the magnitude to the electric charges accumulated on the sample 12 appears at the electrode 11.

More specifically, the measurement was performed on a grounded clean bench, with the detecting electrode 11 grounded via a capacitor C3, the sample 12 grounded via a capacitor C1, and the electrode 11 and the sample 12 connected each other by a capacitor C2.

The sector plate 10 is grounded directly. When the sector plate 10 is located between the electrode 11 and the sample 12, the electric field induced by the sample 12 is shielded by the sector plate 10 and the detecting electrode 11 detects a zero voltage. On the other hand, when a gap formed in the sector plate 12 is located between the sample 12 and the electrode 11, the voltage appearing at the electrode 13 is represented as $$Vp = C_2Q/(C_1C_2 + C_2C_3 + C_3C_1)$$

wherein Q represents the amount of electric charges existing on the sample 12. Thus, the voltage signal produced by the electrode 11 is proportional to the electric charges accumulated in the sample 12.

Conventionally, there is a report that plastics are discharged when dried in an environment containing the vapor of IPA. To verify this effect, experiments were conducted to dry the samples of PFA in such an environment containing the vapor of IPA. In the experiment, the samples were dipped first into a deionized water and then dried in the IPA-containing environment held at 82° C. for 10 minutes. As a reference, the same samples were dried, after dipped into the deionized water, in a dry nitrogen atmosphere held at 130° C. for 15 minutes.

Figure 2:
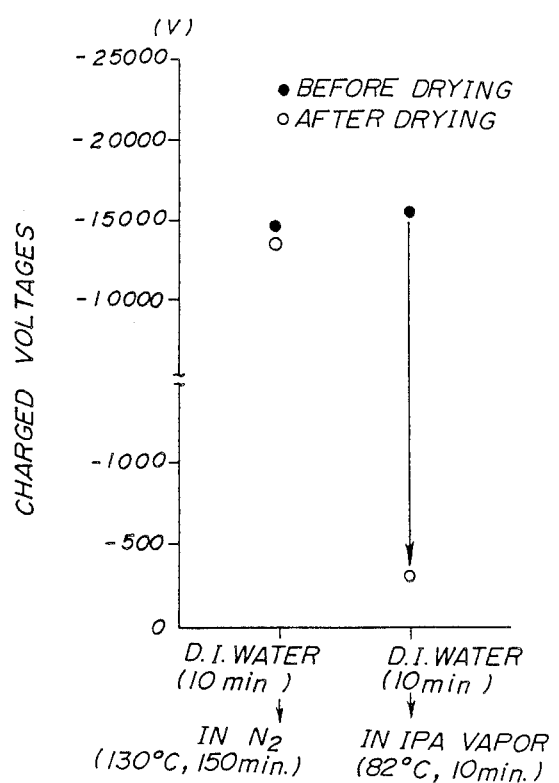
FIG. 2 is a diagram showing the result of an experiment performed in the foregoing study for investigating the formation of electric charges on a sample of PFA after, being held in an environment containing the vapor of PFA.

FIG. 2 shows the result of the electric charge measurement of the samples thus obtained. Referring to FIG. 2, it is distinctly shown that the sample of PFA is charged to a level of about $-15000$ volts immediately after being lifted up from the deionized water, while the electrostatic voltage of the sample is reduced to about $-300$ volts when dried subsequently in the IPA-containing environment. On the other hand, no substantial change was observed in the electric charges in the sample which was dried in the dry nitrogen atmosphere.

Figure 3:
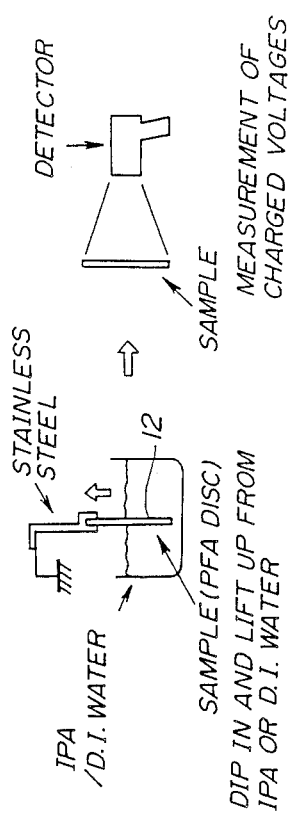
FIG. 3 is a diagram showing schematically another experiment performed in the foregoing study for investigating the effect of dipping the sample of PFA in a pool of IPA and lifting up therefrom, on the electric charges formed on the surface of the sample by such a process.

To study the effect of IPA and the deionized water on the dissipation of the electric charges accumulated on PFA more precisely, experiments shown in FIG. 3 were conducted. In these experiments, discs of PFA having a diameter of 100 mm and a thickness of 3 mm were prepared as the samples. In the experiments, the samples were held at a top end part thereof by a tool made of stainless steel and dipped in a pool of IPA and lifted up therefrom or dipped in the deionized water and lifted up therefrom with various speeds of lifting. During the process of dipping in and lifting up, the tool used to hold the sample was grounded. After the lifting up from the pool of IPA or from the deionized water, the electric charges accumulated on the sample was measured by the system described previously with reference to FIG. 1.

Figure 4:
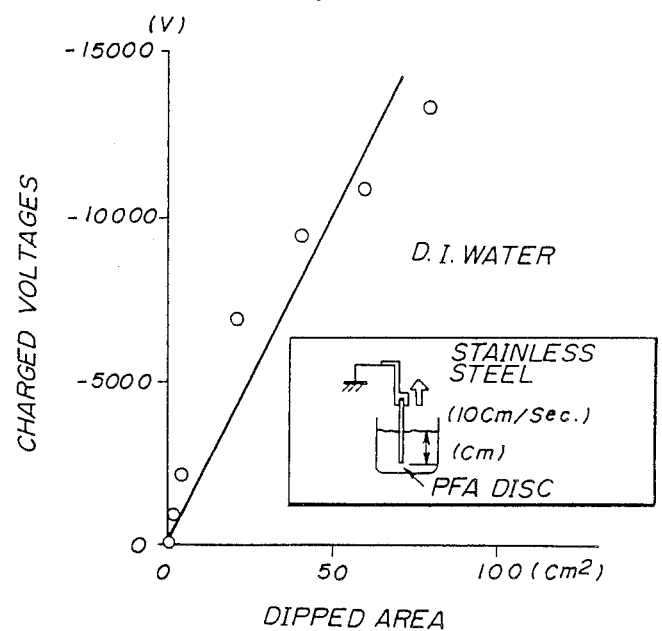
FIG. 4 is a diagram showing an experiment performed in the foregoing study for investigating the relation between the electric charges formed on the sample of PFA and the area of the sample dipped in the deionized water, together with the result of the experiment.

FIG. 4 shows a result of the electric charge measurement for the case in which the sample disc of PFA is lifted up from the deionized water after dipping it with various depth. In other words, the area of the PFA sample which is contacted with the water is changed variously. The speed of lifting the PFA sample was set to 10 cm/sec. As is clearly seen in FIG. 4, it was established that the electric charges accumulated on the PFA sample is generally proportional to the area of the sample disc dipped into the water. This suggests that the electric charges are formed as an interaction between the molecule of water and the surface of the PFA sample, particularly when the molecule of water is separated from the surface of PFA.

Figure 5:
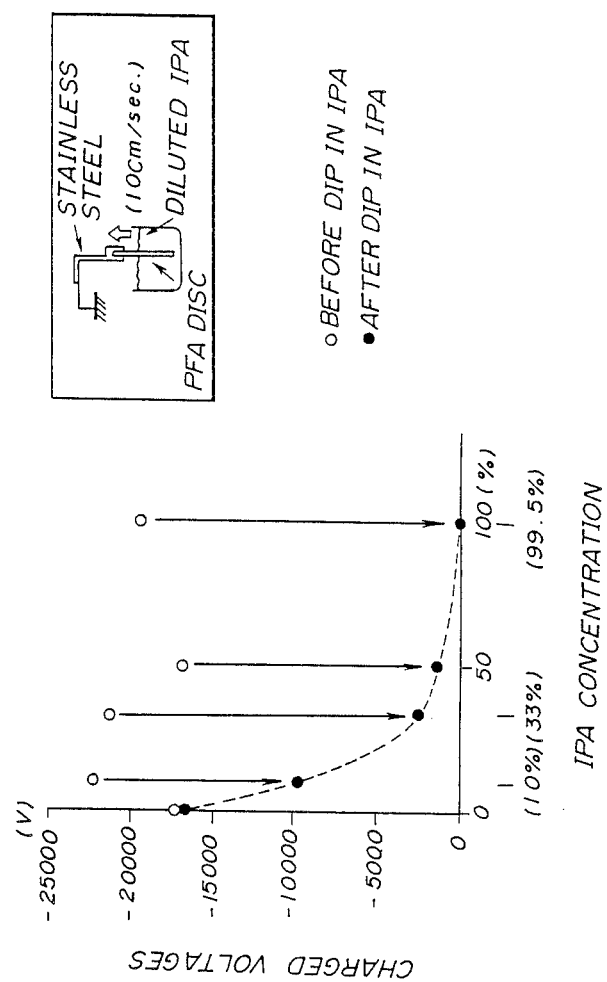
FIG. 5 is a diagram showing another experiment performed in the foregoing study for investigating the relation between the electric charge formed on the PFA sample and the concentration of IPA, together with the result of the experiment.

FIG. 5 shows the result of the electric charge measurement for the PFA sample lifted up from a pool of deionized water admixed with IPA with various concentrations. In the ordinate of the graph, the electric charges detected by the system of FIG. 1 is represented similarly to FIG. 4 while in the abscissa, the concentration of IPA is represented. It should be noted that, when the pool comprises the pure deionized water, i.e. the concentration of IPA is zero, the PFA sample, which has been previously charged before the dipping into the pool, is charged even after the lifting up from the pool with an amount similar to the amount before the dipping. With the increasing concentration of IPA, it was found that the electric charges detected on the PFA sample after lifting up from the pool is decreased and reaches almost zero when the concentration of IPA becomes 99.5%. In other words, it was found that the elimination of the electric charges from PFA is possible by dipping it once into the pool of IPA and lifting it up therefrom while maintaining the PFA sample or body in electrical contact to the ground.

Figure 6:
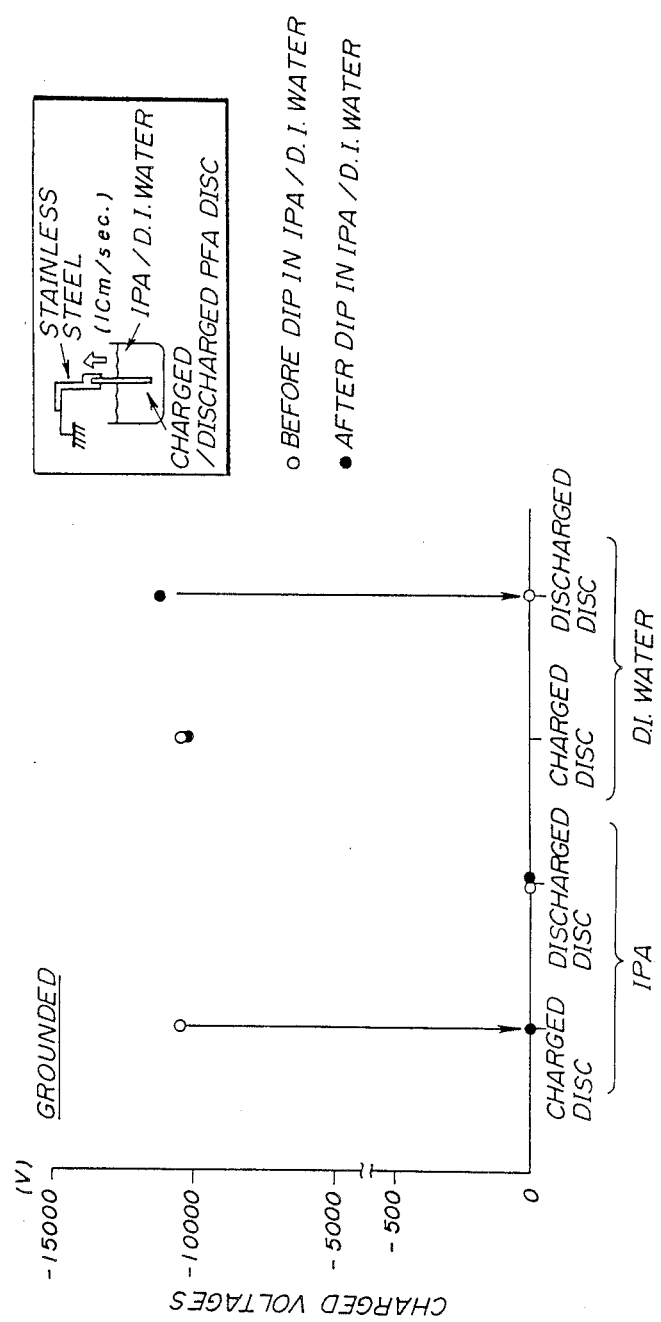
FIG. 6 is a diagram showing another experiment performed in the foregoing study for investigating the charging of the sample of PFA when dipped in the pool of IPA and lifted up therefrom while maintaining a ground connection, in comparison with a case wherein the sample of PFA is dipped in the deionized water and pulled out therefrom.
Figure 7:
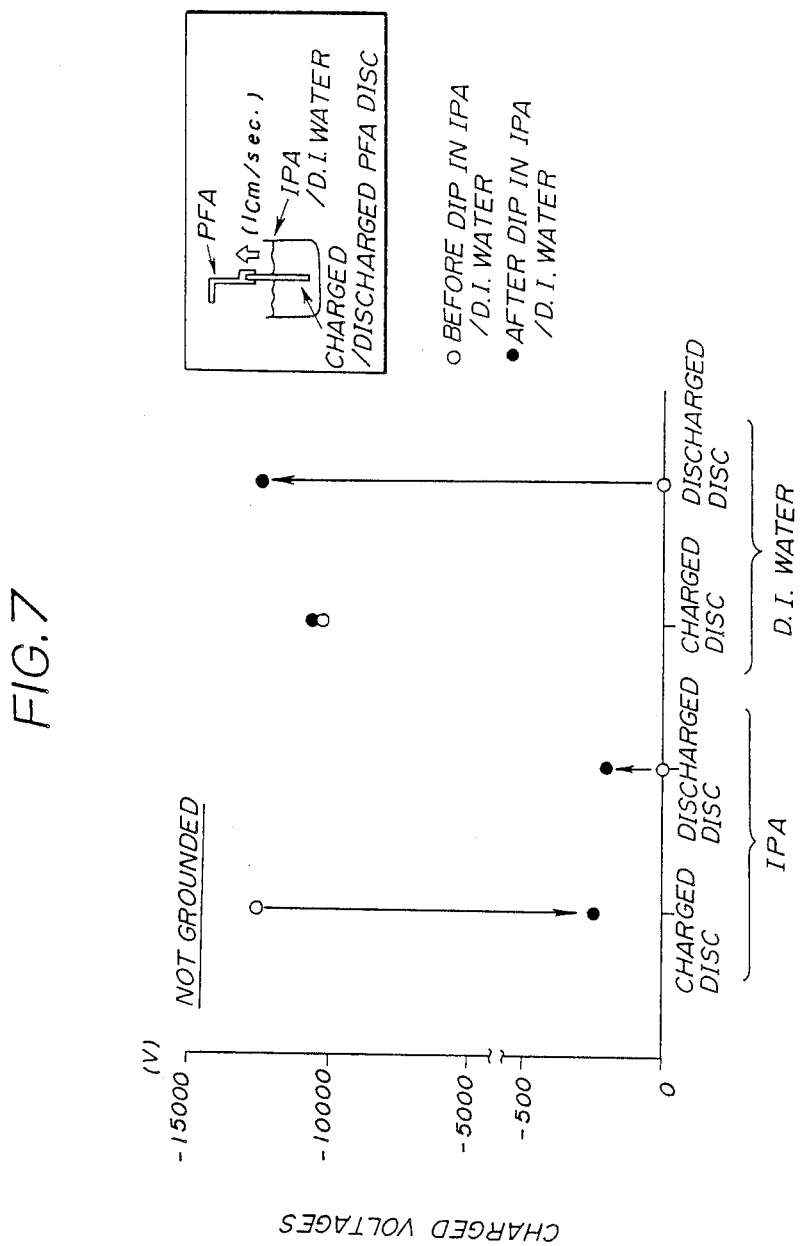
FIG. 7 is a diagram similar to FIG. 6 showing another, but similar experiment wherein the ground connection is not maintained during the step of dipping in and lifted up.

FIGS. 6 and 7 show the result of study made for evaluating the electric charges accumulated on the PFA sample, for the case wherein the sample disc of PFA is held in the electrical contact to the ground and for the case wherein the sample disc is not held in the electrical contact to the ground. In these drawings, FIG. 6 shows the case in which the PFA sample is grounded during the lifting up from the IPA pool or from the deionized water while FIG. 7 shows the case in which the PFA sample is not grounded during the same processes. The speed of lifting up was set to 1 cm/sec throughout.

As clearly seen in FIG. 6, the electric charges induced on the PFA sample is entirely eliminated after being lifted up from the IPA pool irrespective of whether the sample is charged before the dipping or not. On the contrary, as can be seen also in FIG. 6, it was confirmed that the electric charges remains on the sample disc of PFA when the sample disc of PFA which is already charged is dipped in and pulled out from the deionized water. Further, it was found that the PFA sample which was discharged previously to the dipping, is charged to the level as high as $-10000$ volts more more as a result of dipping in the deionized water and pulling out therefrom.

In FIG. 7, it can be seen that the electric charges which had been accumulated on the PFA sample previously to the dipping into the IPA pool is substantially reduced when lifted up from the IPA pool even without the ground connection, as represented by the solid circle at the left end of the graph. Note that the sample disc thus lifted up from the IPA pool maintains a residual electric charge corresponding to the charge voltage of about $-200 - -300$ volts. Electric charges of similar magnitude appears also when a completely discharged PFA sample is dipped in and lifted up as represented by the solid circle located in the drawing immediately to the right of the foregoing solid circle. On the other hand, when the PFA sample is dipped into the deionized water and lifted up therefrom, a result similar to those shown in FIG. 6 is obtained irrespective of whether the sample disc is charged or discharged prior to the dipping. The present finding shown in FIG. 7 indicates that the substantial amount of electric charges can be eliminated from the PFA body by simply dipping the body into a pool of IPA which is held at the ground potential level and then lifting up therefrom irrespective of whether with PFA body is grounded during the foregoing procedure.

From the foregoing results, it is inferred that, although the PFA discs are discharged when they are dipped in the deionized water or in the pool of IPA, the PFA discs are charged electrically upon lifting up from the deionized water or lifting up from the IPA pool, passing through the surface of water or IPA. When the sample disc of PFA is electrically grounded at the top part of the disc by the stainless steel tool, the electric charges are caused to flow to the ground passing through the top part of the sample disc while when it is not grounded, the electric charges remain undissipated.

Figure 8:
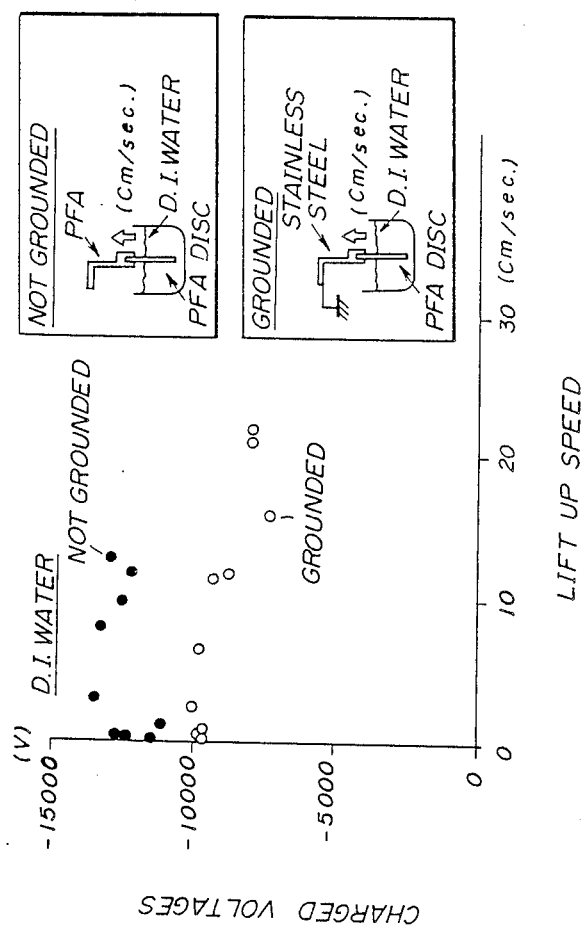
FIG. 8 is a diagram showing the result of the foregoing experiments of FIGS. 6 and 7 for the case wherein the sample of PFA is dipped in the deionized water and lifted up therefrom with various speeds of lifting.
Figure 9:
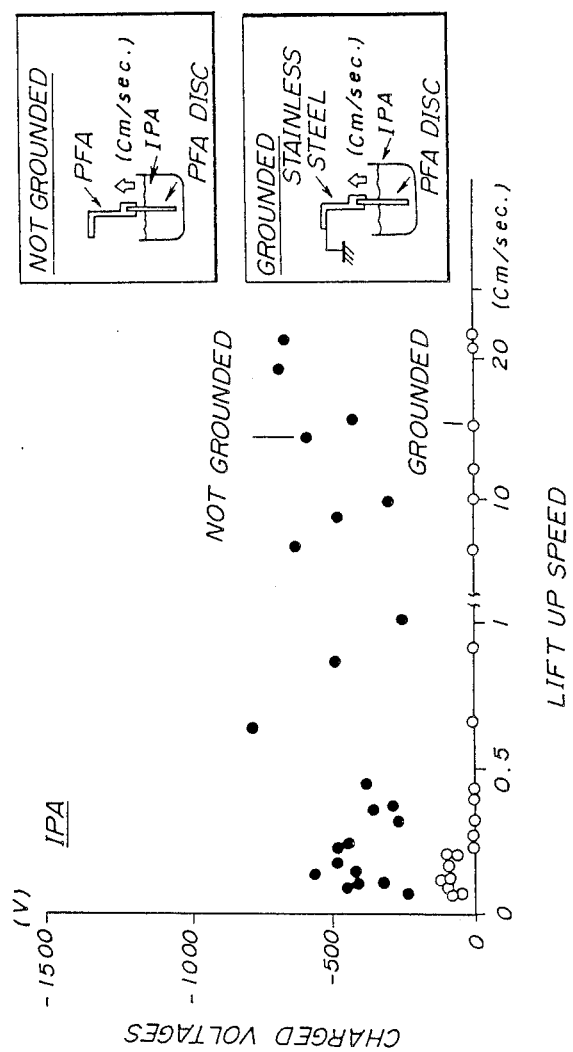
FIG. 9 is a diagram similar to FIG. 8 wherein the sample of PFA is dipped in the pool of IPA and lifted up therefrom with various speeds of lifting.

FIGS. 8 and 9 show the relation between the electric charges and the speed of lifting the sample disc from the deionized water or IPA. In each of the drawings, the open circles represent the case wherein the PFA sample is not grounded during the lifting up procedure while the solid circles represent the case wherein the PFA sample is grounded during the same procedure. As is clearly seen in these drawings, the samples which are grounded during the lifting up from the deionized water is charged less as compared to the samples which are not grounded in the same process, in conformity with the foregoing results. Further, the samples which are lifted up from IPA while maintaining the ground connection are substantially free from electric charges except those which were lifted up with an extremely slow speed smaller than about 0.2 cm/sec. These samples maintain the charge voltage of about $-100$ volts.

In general, there is no definite tendency of the electric charges with respect to the speed of lifting up as long as the samples are lifted up while not maintaining the ground connection. In the case of the samples which were lifted up from the deionized water while maintaining the ground connection, there is a tendency that the electric charges formed in response to the lifting up is decreased with increasing speed of lifting.

The foregoing observation suggests the following. When the sample discs are lifted up from the IPA pool, the part of the disc which has been submerged in IPA is covered by a thin film of IPA which persists even after the lifting up. This thin film, however, disappears gradually possibly because of the evaporation of IPA, and when the speed of lifting is excessively slow, the film disappears from the surface of the disc even when the bottom part of the sample disc is still in the pool. On the other hand, when the speed of lifting is sufficiently large, the lifting of the PFA sample is made in a short time and the film persists even when the sample disc is completely lifted up from the IPA pool. Thereby, the dissipation of the electric charges occurs through this film. On the other hand, in the case of the PFA sample is lifted up from the deionized water, it is inferred that the coverage of the surface of the sample disc by the thin film of water does not occur because of the hydrophobic nature of PFA. Thus, because of the absence of the film providing the path for dissipation of the electric charges, there appears a large electric charge on the sample disc of PFA immediately when it is lifted up from the deionized water.

Figure 10:
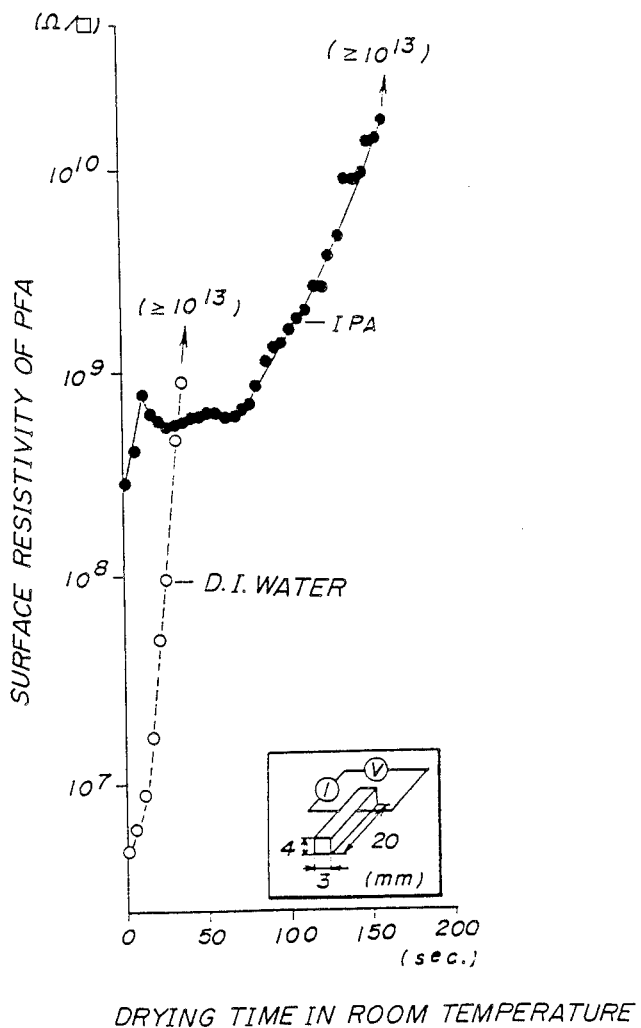
FIG. 10 is a diagram showing the change of the surface resistivity of a sample of PFA in response to the evaporation of IPA droplet wetting the surface of the sample in comparison with the corresponding change of the surface resistivity in response to the contraction of a droplet of deionized water dropped on the same surface.

FIG. 10 shows the result of experiments conducted for studying the effect of evaporation of IPA on the surface resistivity of PFA.

In this experiment, a sample piece of PFA having a size of 3 mm $\times$ 4 mm $\times$ 20 mm was prepared and a droplet of IPA was used to wet the top surface of the sample piece. The resistivity of the top surface of the sample piece was then measured while evaporating the droplet of IPA at the room temperature. The result is shown in FIG. 10 by solid circles. For the purpose of comparison, the result of a similar test conducted for the case of deionized water is shown in FIG. 10 by open circles.

In FIG. 10, an asterisk symbol * represents the instance that the top surface of the PFA sample piece is apparently dried when observed by the naked eyes. As can be seen, the surface resistivity of the PFA surface wetted by the droplet of IPA remains at about $5 \times 10^8$ $\Omega/\square$ for several tens of seconds even after the surface of PFA is apparently dried. After this, the resistivity increases monotonously but it takes several minutes or more until the original surface resistivity pertinent to PFA (about $10^{18}$ $\Omega/\square$) is recovered. Such a low surface resistivity supports the theory that there exists an invisible film of IPA providing the path of dissipation of electric charges even when the PFA body is lifted up from the pool of IPA.

When a droplet of deionized water is placed and dried on the PFA test sample, on the other hand, the surface resistivity of PFA increases rapidly to about $10^9$ $\Omega/\square$ as shown by the open circles, and once the coverage of the surface in correspondence to the area where the electrode is provided by the water droplet disappears (shown in FIG. 10 by double asterisks **), the surface resistivity jumps to the value pertinent to PFA. This means that no substantial film of water is formed on the surface of PFA.

Summarizing the observations described heretofore, a possible mechanism of charge and discharge of PFA is derived as follows.

Figure 11:
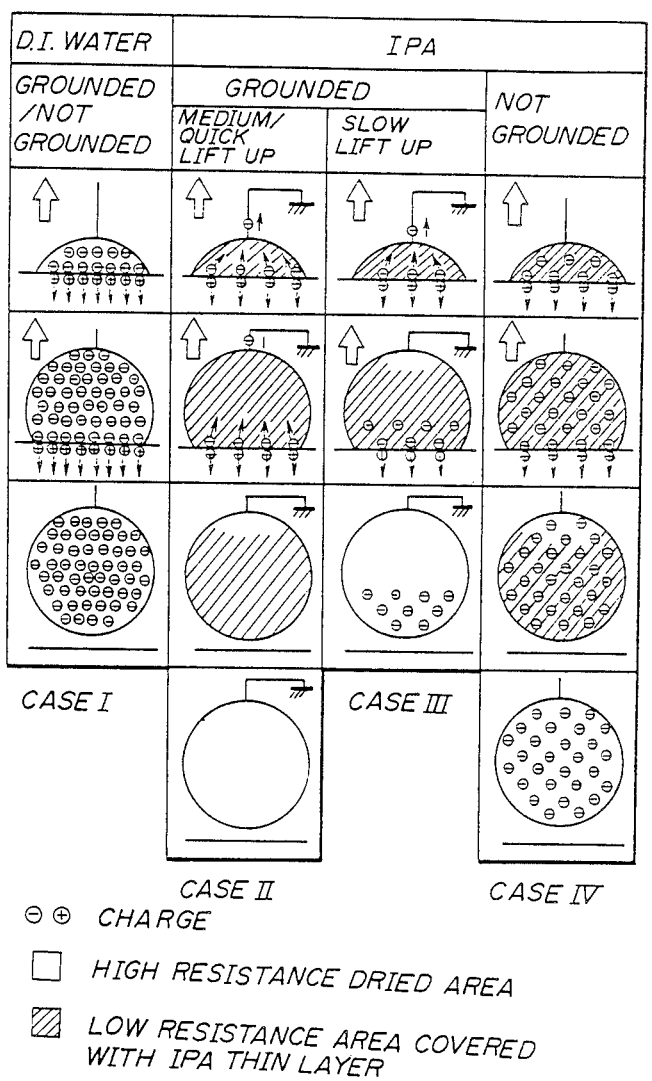
FIG. 11 is a diagram showing a model of charging and discharging of the surface of the sample of PFA in response to lifting up from the deionized water or in response to the lifting up from the pool of IPA.

Referring to FIG. 11, when the PFA disc is lifted up from the deionized water, the disc is immediately dried whenever it is pulled out from the water. No water remains o the disc because of the hydrophobic nature of PFA. In response to the water molecule separating from the surface of the PFA disc, the surface is charged negatively and thus, substantially the entire surface of the PFA disc is charged negatively as shown in FIG. 11 as CASE I. In FIG. 11, it should be noted that the shaded area represents the surface which is covered by a visible or invisible film of liquid such as IPA or water while the blank area represents the surface which is entirely dried.

When the PFA disc is lifted up from the pool of IPA with a medium to high speed of lifting in a manner that the connection of the disc to the ground is maintained, any electric charge which is induced in response to the separation of the IPA molecule from the surface of the PFA disc is immediately dissipated to the ground through the low resistivity film formed on the exposed surface of the PFA disc as shown in FIG. 11 as CASE II. After the disc is entirely lifted up from the IPA pool, the surface of the disc starts to dry. As the electric charges are removed already from the disc, the disc is free from the electric charges even when it is completely dried.

In the case when the speed of lifting up is slow, the top part of the disc starts to dry even when the bottom part of the disc is still in the pool of IPA. In such a case, the electric charges remaining or newly formed on the PFA disc after the film of IPA is disappeared from the top part of the disc, are no longer dissipated as shown in FIG. 11 as CASE III. These remaining electric charges cause the electric voltage of about $-100$ volts in correspondence to the data represented by the solid circles located close to the origin of the graph of FIG. 9 as already described.

In the case when the PFA disc is lifted up from the pool of IPA while not connected to the ground, the electric charges created on the surface of the PFA disc in response to the lifting up from the IPA pool is not dissipated to the ground as shown in FIG. 11 as CASE IV. However, the amount of the electric charges thus formed is significantly smaller than the case of lifting up the PFA disc from the deionized water. The electric charges of CASE IV of FIG. 11 corresponds to the voltages shown in FIG. 9 by the solid circles. This voltage is about −500 volts in the average.

Next, a first embodiment of the present invention which is directly derived from the foregoing findings will be described with reference to FIGS. 12A and 12B.

Figure 12A:
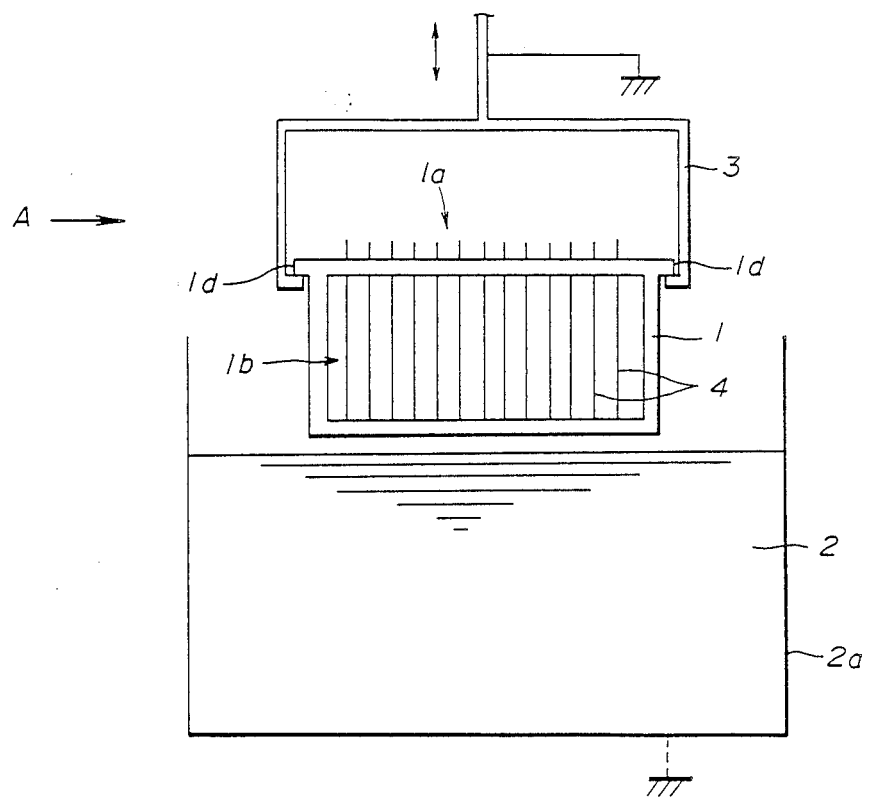
FIG. 12A is a diagram showing a first embodiment of the present invention.
Figure 12B:
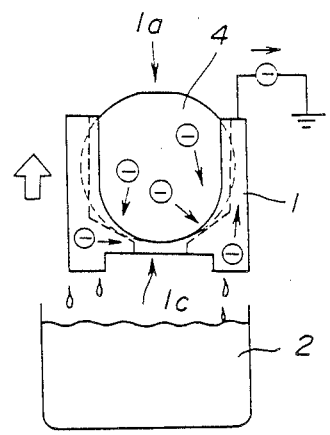
FIG. 12B is a diagram showing an end view of the first embodiment viewed from a direction shown by an arrow A in FIG. 12A.

FIG. 12A shows a container or carrier 1 of PFA used conventionally in the fabrication process of semiconductor devices for accommodating semiconductor wafers 4. Referring to FIG. 12A, the carrier 1 is a conventional type carrier constructed as a generally rectangular box or basket with lateral openings 1b as well as top and bottom openings 1a and 1c as clearly seen in the end view of FIG. 12B. The semiconductor wafers 4 are placed in the carrier 1 through the top opening 1a and is held therein with a separation from each other by a not-illustrated partition formed in the carrier 1.

The carrier 1 further has projections 1d at both ends thereof adapted to be engaged by a holding member 3 of a conductive material such as stainless steel. In use, the holding member 3 is electrically grounded and picks up the carrier 1. Thereby, the holding member 3 holds the carrier 1 on a pool 2 of IPA which in turn is held in a container 2a. This container 2a may be electrically grounded.

Next, the holding member 3 is lowered and thereby the carrier 1 is dipped into the pool 2 to such an extent that the semiconductor wafers 4 carried by the carrier 1 is entirely submerged in the pool 2 of IPA. Because of the lateral as well as top and bottom openings 1a-1c, the liquid of IPA immediately enters into the carrier 1 and makes a contact with the surface of the carrier 1 as well as the surface of the wafers 4. The duration for holding the carrier 1 and the wafers 4 submerged in the pool 2 of IPA may be a few seconds.

Next, the carrier 1 is lifted up from the pool 2 with a speed preferably larger than about 0.2 cm/sec. In response to the lifting up, the liquid of IPA is quickly ran out from the carrier 1 through the lateral and bottom openings 1b and 1c and the carrier 1 is emptied except of course for the wafers 4. During this process, the electric charges created at the surface of the wafer 4 are dissipated to the ground, passing through the film of IPA and conducted along the holding member 3. It should be noted that the electric charges created on the surface of the wafers 4, too, are dissipated passing through the contacts between the wafer 4 and the carrier 1. By performing the foregoing operation, the electric charges are entirely and completely removed from the wafer 4 as well as from the carrier 1 and thus, the problem of carrier 1 or the wafer 4 attracting the dusts is eliminated.

It should be noted that such a process is effective whenever the process is applied after the step of cleaning the wafer 4 in the deionized water together with the container 1 or whenever the process is applied prior to other processes of fabricating the semiconductor devices. Further, such a process is effective for preventing the adsorption of dusts when applied prior to the exposure of the semiconductor wafers to an environment including dusts. Such an exposure may include storage or transport of the wafers 4 together with the carrier 1. In any case, the present invention is effective in eliminating the electric charges after the process of cleaning in the deionized water.

Figure 13:
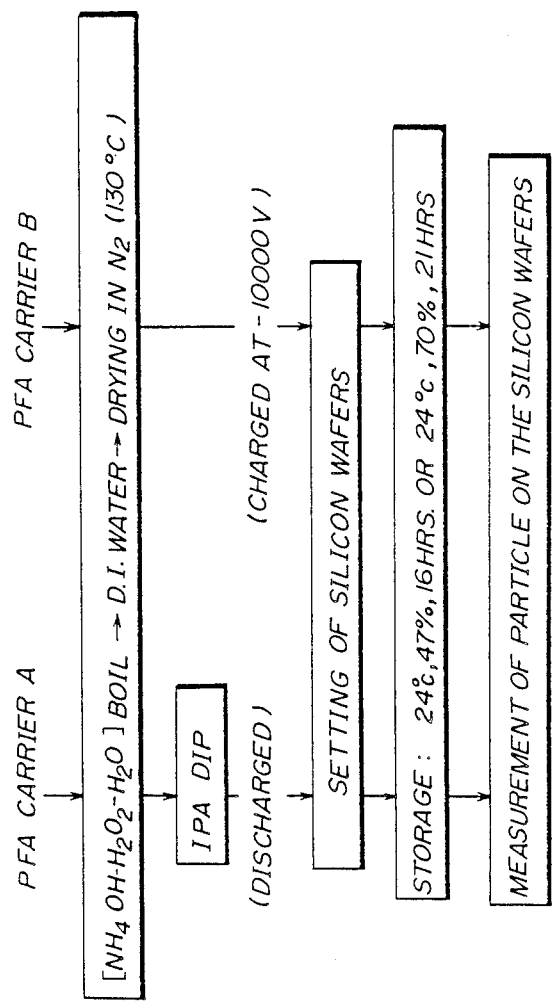
FIG. 13 is a diagram showing steps performed in a test to demonstrate the effect of the present invention.

FIG. 13 shows the result of an experiment undertaken to demonstrate the effect of the present invention, wherein an evaluation is made for the number of dusts adsorbed on the surface of a wafer after the process of immersion in the pool 2 of IPA and subsequent lifting up therefrom. The experiment was conducted for wafers having a diameter of 4 inches. First, the PFA carrier 1 was treated in a boiling aqueous solution of ammonia ($NH_4OH$) and hydrogen peroxide ($H_2O_2$), cleaned subsequently in the distilled water, and further dried in the dry nitrogen atmosphere at 130° C., prior to the process of dipping and lifting up. Next, the wafers were stored in the carrier 1 after the the carrier 1 is lifted up from the pool of IPA, and the wafers were stored together with the carrier 1 in a clean environment provided by a clean bench of class 10 either for 16 hours under the humidity of 47% or for 21 hours under the humidity of 70%. The temperature of the environment was held at 24° C. for both cases. At the beginning and at the end of the experiment, the surface of the wafers was examined and the number of particles having a diameter larger than 0.3 $\mu$m was counted. In order to evaluate the result, the same test was conducted, as a reference test, for the semiconductor wafers which were stored in the same clean environment without the process of being dipped in the pool of IPA and lifted up therefrom. In other words, the wafers for the reference samples are stored in the clean environment immediately after the step of drying in the dry nitrogen atmosphere at 130° C. As already described, the carrier 1 in the latter case is charged to about −10,000 volts.

FIG. 14 compares the result of the foregoing test with the result of the reference test for the wafers having the diameter of 4 inches. In the both tests, the wafers were stored in the clean bench for 21 hours at 24° C. under the humidity of 70% together with the carrier as already described. As is clearly seen in FIG. 14, the total number of the particles which was detected was only fourteen in the case of the substrate applied with the processing of the present invention, while it was found that the total number of the particles adsorbed on the wafer reached 92 in the case of the reference test. In FIG. 14, the particles having diameters equal to or larger than 2 $\mu$m are designated as "L", the particles having diameters between 0.5 $\mu$m and 2 $\mu$m are designated as "M", and the particles having diameters between 0.3 $\mu$m and 0.5 $\mu$m are designated as "S". From FIG. 14, it is clearly demonstrated that the process of the present invention is extremely effective in reducing the dusts adsorbed on the wafer.

Figure 15:
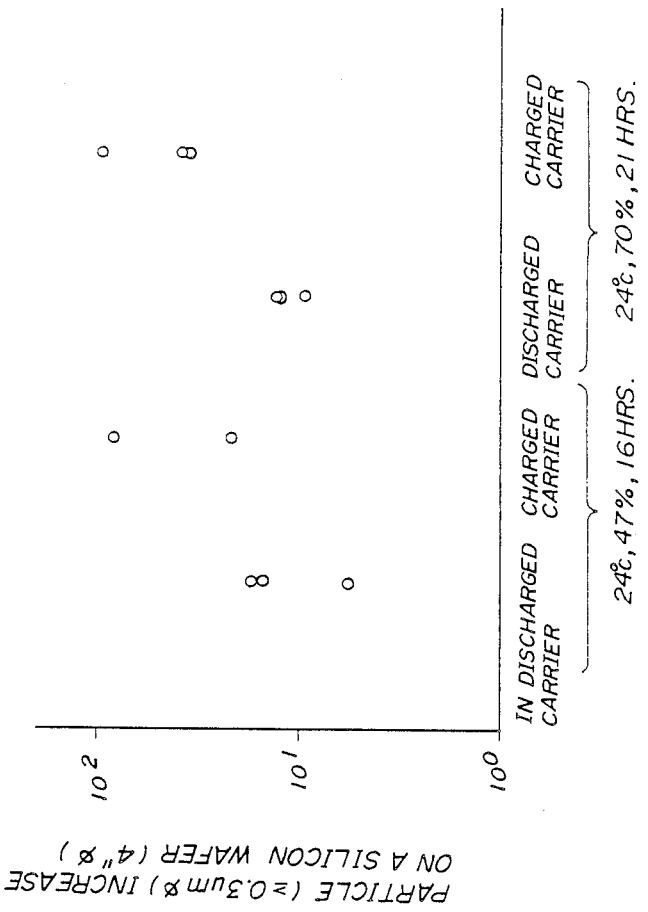
FIG. 15 is another diagram showing the result of the test of FIG. 13.

FIG. 15 compares the result of the foregoing tests arranged in accordance with the conditions of the storage in the clean bench. In any of these conditions of the storage, it is clearly shown that the number of dusts adsorbed on the surface of the wafer is significantly smaller when the substrate is treated in the IPA as compared to the case of the reference test.

Thus, it is demonstrated distinctly that the process of the first embodiment of the present invention wherein the wafer of the semiconductor device held on the PFA carrier is submerged into the pool of IPA together with the carrier and lifted up therefrom, is extremely effective in reducing the number of dusts adsorbed on the surface of the wafer. From the foregoing study detailed with reference to FIGS. 1–11, this effect of the present invention is undoubtedly due to the elimination of the electric charge from the carrier and thus from the wafer held on the carrier. This process is particularly powerful when applied after the step of cleaning the wafer in the deionized water.

Figure 16:
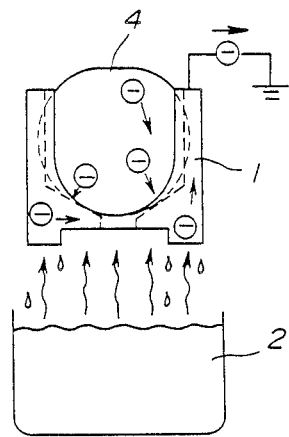
FIG. 16 is a diagram showing a second embodiment of the present invention.

FIG. 16 shows a second embodiment of the present invention. In this embodiment, the elimination of the electric charges from the surface of the carrier 1 and the wafer 4 held therein is made without dipping the carrier and the wafer into the pool of IPA but by simply holding them above the pool of IPA and exposing them to the the vapor of IPA. Similarly to the case of the first embodiment, the carrier 1 and the wafer 4 are held by the conductive member 3 which is connected to the ground during this procedure.

In this embodiment, the surface of the wafer 4 as well as the surface of the carrier 1 are covered by the film of IPA which is condensed thereon, and the electric charge is dissipated to the ground, passing through the film of IPA and through the holding member 3. In this embodiment, too, a successful elimination of the electric charge and thus the reduction of adsorption of dusts on the wafer is achieved.

Figure 17:
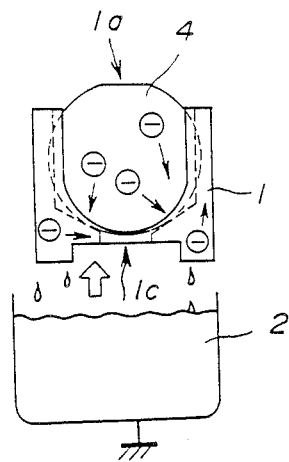
FIG. 17 is a diagram showing a third embodiment of the present invention.

FIG. 17 shows a third embodiment of the present invention wherein the carrier 1, together with the wafer 4 carried thereon, are dipped into the pool 2 of IPA and lifted up therefrom without being grounded. In this embodiment, the holding member 3 is formed from an insulating material such as PFA or silica. As already described with reference to FIGS. 7 and 9, PFA is substantially discharged, if not completely, by dipping into the pool of IPA and lifting up therefrom. Thereby, the attraction of the dusts to the carrier 1 as well as to the semiconductor wafer 4 is substantially reduced. This process is easy to carry out and quite effective for eliminating the electric charges when applied after the step of cleaning the wafer in the deionized water.

In the description heretofore, it is assumed that the carrier 1 is made of PFA. However, it should be realized that the material to which the present process is effective is not limited of PFA, but other plastic materials of high resistivity such as polypropylene or even inorganic materials such as silica may be employed. In any of the cases where the materials of high resistivity other than PFA is used, too, the problem of undesirable accumulation of the electric charges, caused by the high resistivity of the carrier, is successfully eliminated by applying the process as described in the first through third embodiments of the present invention.

Further, the part of the carrier 1 where the projections 1a for engagement with the holding member 3 are provided is not limited to the top part of the carrier 1 but may be formed in the lower part of the carrier 1 as long as the mechanical stability of the carrier allows.

Furthermore, the material used for discharging the carrier is not limited to IPA but other volatile organic solvents showing an excellent wetting over the material forming the carrier such as ethylalcohol, acetone, or trichloroethylene may be used.

Further, the present invention is not limited to the foregoing embodiments but various variations and modifications may be made without departing from the scope of the invention.

What is claimed is:

1. A method of fabricating a semiconductor device, comprising steps of:
   accommodating a substrate on which the semiconductor device is to be fabricated in a container of an electrically insulating material;
   forming a film of a volatile organic solvent such that the film covers substantially an entire surface of the container and the substrate accommodated therein, said step of forming the film being performed while maintaining a connection between the film of the volatile organic solvent covering the surface of the container and the ground, so that electric charges are eliminated from the substrate and the container by flowing to the ground; and
   removing the film of the volatile organic solvent by evaporating the solvent.

2. A method as claimed in claim 1 in which said film of the volatile solvent is formed by dipping the substrate and the container in a pool of the volatile organic solvent and subsequently lifting up therefrom.

3. A method as claimed in claim 1 in which the film of the volatile organic solvent is formed by condensing a vapor of the volatile organic solvent on the entire surface of the substrate and the container.

4. A method as claimed in claim 1 in which said volatile organic solvent comprises an organic solvent which causes an excellent wetting when contacted with the container.

5. A method as claimed in claim 4 in which said volatile organic solvent is selected from a group consisting of isopropyl alcohol, ethylalcohol and trichloroethylene.

6. A method as claimed in claim 1 in which said container is formed of a material selected from a group consisted of perfluoroalcoxy resin and polyprolynene.

7. A method of fabricating a semiconductor device comprising steps of:
   accommodating a substrate on which the semiconductor device is to be fabricated, in a container of an electrically insulating material;
   cleaning the substrate together with the container in a purified water;
   dipping the container, after the step of cleaning in the purified water, together with the substrate accommodated therein, into a pool of a volatile organic solvent held electrically at the ground voltage level;
   removing the substrate together with the container from the pool of the volatile organic solvent; and
   removing the volatile organic solvent from the substrate and the container by evaporating the solvent.

8. A method of fabricating a semiconductor device on a substrate comprising a step of holding the substrate in an environment containing dusts, said method comprising steps of:
   accommodating a substrate on which the semiconductor device is to be fabricated in a container of an electrically insulating material, said container being connected to the ground by an electrically conductive means; and
   exposing the substrate together with the container accommodating the substrate, prior to the step of holding the substrate in the environment containing dusts, to an atmosphere containing the volatile organic solvent while maintaining the connection to the ground, so that electric charges on the substrate and the container are eliminated therefrom by flowing to the ground.

* * * * *